United States Patent
Tobe et al.

(10) Patent No.: US 10,539,709 B2
(45) Date of Patent: Jan. 21, 2020

(54) MULTI-OPTICAL AXIS PHOTOELECTRIC SENSOR

(71) Applicant: OMRON Corporation, Kyoto-shi, Kyoto (JP)

(72) Inventors: Takuya Tobe, Kusatsu (JP); Keisaku Kikuchi, Kusatsu (JP)

(73) Assignee: OMRON Corporation, Kyoto-shi (JP)

( * ) Notice: Subject to any disclaimer, the term of this patent is extended or adjusted under 35 U.S.C. 154(b) by 6 days.

(21) Appl. No.: 15/687,603

(22) Filed: Aug. 28, 2017

(65) Prior Publication Data
US 2018/0088251 A1    Mar. 29, 2018

(30) Foreign Application Priority Data
Sep. 28, 2016 (JP) .................................. 2016-189389

(51) Int. Cl.
*G01V 8/12* (2006.01)
*F16P 3/14* (2006.01)
*H03K 17/96* (2006.01)

(52) U.S. Cl.
CPC ............... *G01V 8/12* (2013.01); *F16P 3/144* (2013.01); *H03K 17/9618* (2013.01)

(58) Field of Classification Search
CPC .. G01V 8/12; G01V 8/20; F16P 3/144; H03K 17/9618
(Continued)

(56) References Cited

U.S. PATENT DOCUMENTS 5,130,532 A * 7/1992 Clemens ................. G01V 8/20
                                                         250/221
6,979,814 B2 * 12/2005 Kudo ...................... F16P 3/144
                                                         250/221
(Continued)

FOREIGN PATENT DOCUMENTS

CN          1983488 B      5/2010
CN        105371094 A      3/2016
(Continued)

OTHER PUBLICATIONS

Extended European search report (EESR) dated Jun. 14, 2018 in a counterpart European application.
(Continued)

*Primary Examiner* — Seung C Sohn
(74) *Attorney, Agent, or Firm* — Metrolex IP Law Group, LLP

(57) ABSTRACT

A multi-optical axis photoelectric sensor includes a sensor unit configured to detect whether each of plural optical axes formed between a projection unit and a light receiving unit is in a light shielding state, the sensor unit including the projection unit and the light receiving unit, the projection unit including plural projection elements, the light receiving unit including plural light receiving elements disposed opposite the plural projection elements. The multi-optical axis photoelectric sensor also includes a control unit that controls the light receiving unit, communication cables of plural signal wirings through which a signal is input to and output from the control unit, and a communicator that conducts communication between the control unit and an external device through a common wiring sharing one of the communication cables with a communication wiring.

10 Claims, 7 Drawing Sheets

(58) Field of Classification Search
USPC .......................................................... 250/221
See application file for complete search history.

(56) References Cited

U.S. PATENT DOCUMENTS

| | | | |
|---|---|---|---|
| 9,200,955 B2 * | 12/2015 | Kawabata | G01V 8/20 |
| 9,977,148 B2 * | 5/2018 | Tellkamp | G01V 8/20 |
| 2007/0125938 A1 | 6/2007 | Kikuchi et al. | |
| 2008/0179504 A1 | 7/2008 | Inoue et al. | |
| 2010/0193668 A1 | 8/2010 | Kawabata | |
| 2011/0206366 A1 | 8/2011 | Klingelhöfer | |
| 2015/0301221 A1 | 10/2015 | Kikuchi et al. | |
| 2016/0041301 A1 | 2/2016 | Kikuchi et al. | |

FOREIGN PATENT DOCUMENTS

| | | | |
|---|---|---|---|
| JP | 2002-296361 A | | 10/2002 |
| JP | 2006-317237 A | | 11/2006 |
| JP | 2006317237 | * | 11/2006 |
| JP | 2007-150986 A | | 6/2007 |
| JP | 2008-181798 A | | 8/2008 |
| KR | 10-2015-0120848 A | | 10/2015 |
| KR | 10-2016-0018360 A | | 2/2016 |

OTHER PUBLICATIONS

European search report (ESR) dated Feb. 21, 2018 in a counterpart European patent application.
Office communication dated Jul. 9, 2019 in a counterpart Korean patent application.
Office Action dated Feb. 20, 2019, in a counterpart Chinese patent application.
Office Action dated Feb. 25, 2019, in a counterpart Korean patent application.

* cited by examiner

MULTI-OPTICAL AXIS PHOTOELECTRIC SENSOR

CROSS-REFERENCE TO RELATED APPLICATION

This application is based on Japanese Patent Application No. 2016-189389 filed with the Japan Patent Office on Sep. 28, 2016, the entire contents of which are incorporated herein by reference.

FIELD

The present invention relates to a multi-optical axis photoelectric sensor. Particularly the present invention relates to a multi-optical axis photoelectric sensor including a communication function of conducting communication with an external device.

BACKGROUND

A general multi-optical axis photoelectric sensor includes a projection unit in which plural projection elements are arrayed in line and a light receiving unit in which plural light receiving elements as many as the projection elements are arrayed in line while the light receiving element is opposite each of the projection elements.

The multi-optical axis photoelectric sensor detects whether each of plural optical axis formed between the projection unit and the light receiving unit is in a light shielding state.

The projection unit sequentially causes the projection element to emit light. In synchronization with emission operation of the projection element, the light receiving unit measures a light reception amount of the light receiving element from the light receiving element corresponding to each projection element. Therefore, the multi-optical axis photoelectric sensor can sequentially detect the light shielding state in each optical axis.

The light receiving unit determines whether an object exists in a detection area formed between the projection unit and the light receiving unit using a detection result of each optical axis, and outputs a signal indicating a determination result. The projection unit and the light receiving unit are connected to each other through a communication line to synchronize the projection unit and the light receiving unit with each other. Alternatively, the projection unit and the light receiving unit are connected to each other by optical communication to synchronize the projection unit and the light receiving unit with each other.

For example, the multi-optical axis photoelectric sensor is installed as a safety device for a worker in a production site. The installed multi-optical axis photoelectric sensor stops operation of a production facility when the light shielding state is detected in one of the optical axes in the detection area. It is necessary to change a setting of the multi-optical axis photoelectric sensor according to the production facility installed in the production site or an environment. In a multi-optical axis photoelectric sensor described in Japanese Unexamined Patent Publication No. 2002-296361, a setting console is connected to the multi-optical axis photoelectric sensor to set definitions of various kinds of detection operation.

However, in the case that the setting console that is of an external device is connected to the multi-optical axis photoelectric sensor, it is necessary to provide a dedicated communication wiring in order to connect the multi-optical axis photoelectric sensor to the external device, or it is necessary to use the communication line between the projection unit and light receiving unit, which may result in an increased number of wirings. Additionally, the number of installed multi-optical axis photoelectric sensors is also increased when the number of installed production facilities is increased in the production site. In the case that many multi-optical axis photoelectric sensors each of which has many wirings are installed, making misconnection of the wiring may be increased with increasing workload of the wiring connection.

SUMMARY

An object of the present invention is to provide a multi-optical axis photoelectric sensor in which the number of wirings can be decreased in the multi-optical axis photoelectric sensor connectable to the external device.

According to one aspect of the present invention, a multi-optical axis photoelectric sensor includes: a sensor unit configured to detect whether each of plural optical axes formed between a projection unit and a light receiving unit is in a light shielding state, the sensor unit including the projection unit and the light receiving unit, the projection unit including plural projection elements, the light receiving unit including plural light receiving elements disposed opposite the plural projection elements; a control unit configured to control the projection unit or the light receiving unit, the control unit being provided in each of the projection unit and the light receiving unit; plural signal wirings through which a signal is input to and output from the control unit; and a communicator configured to conduct communication between the control unit and an external device through a common wiring sharing at least one of the plural signal wirings with a communication wiring.

Preferably the common wiring is a signal wiring through which a control signal is input to the control unit.

Preferably the signal wiring through which the control signal is input to the control unit is a signal wiring through which a muting signal is input, the muting signal disabling temporarily a function.

Preferably the signal wiring through which the control signal is input to the control unit is a signal wiring through which a reset signal is input, the reset signal initializing the control unit.

Preferably the multi-optical axis photoelectric sensor further includes a switch configured to switch whether the common wiring is used as the communication wiring or the signal wiring.

Preferably the communicator transmits a search signal searching whether the external device to be communicated with the control unit is connected to the multi-optical axis photoelectric sensor, and the control unit switches the switch such that the common wiring is used as the communication wiring when the communicator receives a response signal to the search signal from the external device.

Preferably the communicator periodically transmits the search signal during operation of the sensor unit.

Preferably, when communication with the external device is disconnected, the control unit switches the switch such that the common wiring is used as the signal wiring.

Preferably the multi-optical axis photoelectric sensor further includes a converter configured to perform conversion into a communication signal having a frequency band different from a frequency band of a signal used in the signal wiring. The communicator conducts communication between the control unit and the external device using the communication signal converted with the converter in the common wiring Preferably the projection unit and the light receiving unit synchronize with each other using the optical axis formed between the projection unit and the light receiving unit.

In the multi-optical axis photoelectric sensor of the present invention, the number of wirings can be decreased even in the configuration connectable to the external device.

DETAILED DESCRIPTION

Figure 1:
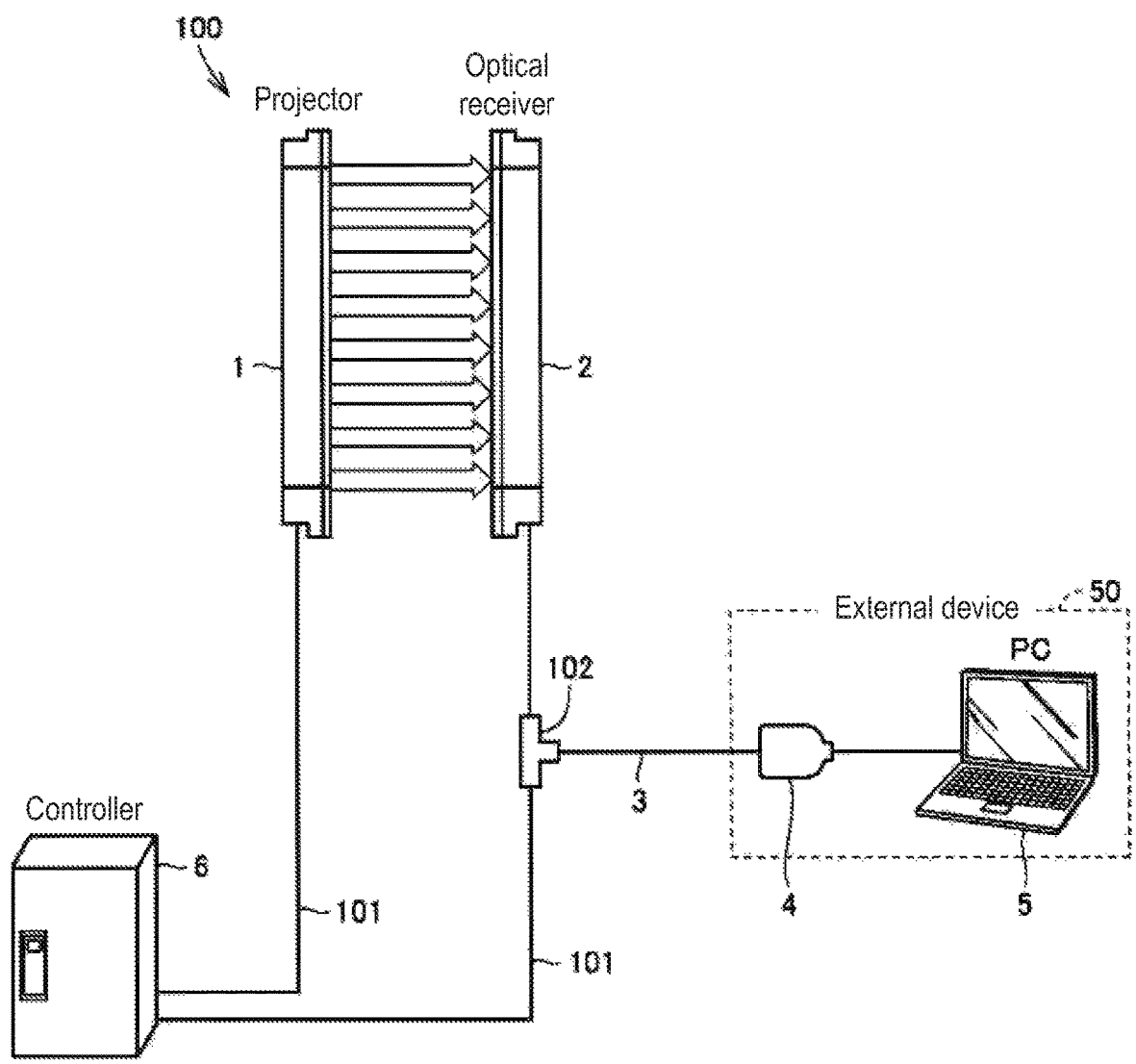
FIG. 1 is a schematic diagram illustrating a configuration example of a multi-optical axis photoelectric sensor according to a first embodiment.

Hereinafter, an embodiment will be described in detail with reference to the drawings. In the drawings, the identical or equivalent component is designated by the identical numeral.

First Embodiment

FIG. 1 is a schematic diagram illustrating a configuration example of a multi-optical axis photoelectric sensor according to a first embodiment. Referring to FIG. 1, a multi-optical axis photoelectric sensor 100 of the first embodiment includes a projector 1, an optical receiver 2, and a controller 6. An arrow indicating a traveling direction of a light beam in FIG. 1 and the light beam are expressed as an optical axis. Accordingly, the term of "the light shielding of the optical axis" is synonymous with the light shielding of the light beam expressed as the optical axis. The multi-optical axis photoelectric sensor 100 can be connected to a personal computer 5 that is of an external device in order to conduct communication with the personal computer 5. The multi-optical axis photoelectric sensor 100 includes a branch connector 102 in a middle of a communication cable 101 on a side of the optical receiver 2 in order to conduct communication with the personal computer 5. The branch connector 102 is connected to the personal computer 5 via a communication unit 4.

Each of the projector 1 and the optical receiver 2 is connected to the controller 6 through the communication cable 101. The communication cable 101 on the side of the optical receiver 2 is branched into a dedicated cord 3 using a branch connector 102, and connected to the communication unit 4 through the dedicated cord 3. The communication unit 4 converts a signal input and output through the dedicated cord 3 into a signal input to and output from the personal computer 5. For example, the communication unit 4 performs serial conversion on an RS485 standard signal, and outputs a signal conforming to standards such as RS232C and universal serial bus (USB). A setting change or operation of the multi-optical axis photoelectric sensor 100 can be monitored when the personal computer 5 is connected to the multi-optical axis photoelectric sensor 100. Sometimes the personal computer 5 and the communication unit 4 are collectively referred to as an external device 50.

Figure 2:
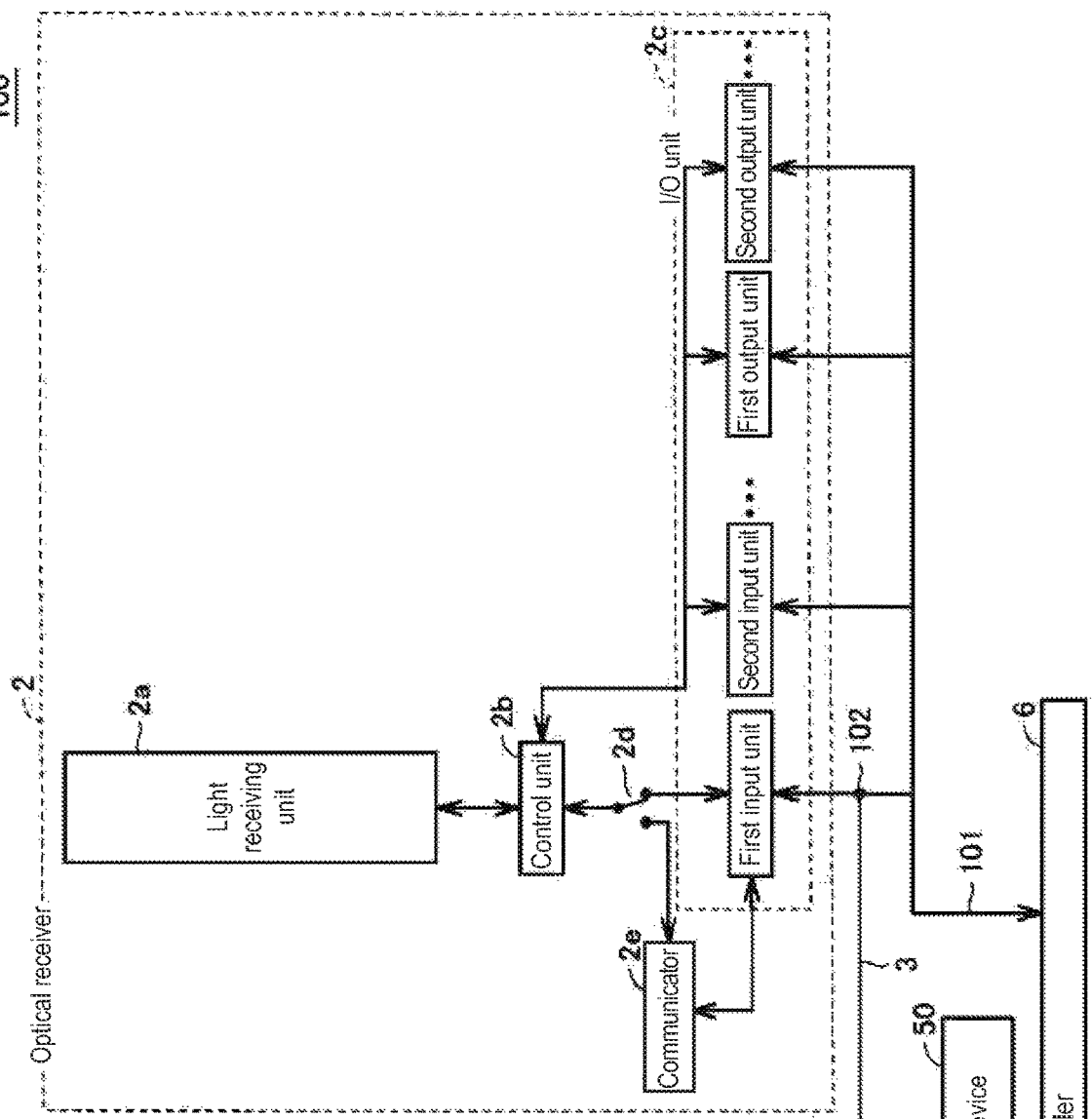
FIG. 2 is a block diagram illustrating a configuration of the multi-optical axis photoelectric sensor of the first embodiment.

FIG. 2 is a block diagram illustrating a configuration of the multi-optical axis photoelectric sensor 100 of the first embodiment. Referring to FIG. 2, the projector 1 includes a projection unit 1a having plural light emitting elements, a control unit 1b that controls the projection unit 1a, and an input/output (I/O) unit 1c that performs input and output on the control unit 1b. The I/O unit 1c is a communication interface, which is connected to the communication cable 101, to control the input and output of a signal transmitted and received between the control unit 1b and the controller 6. The communication cable 101 includes plural signal wirings through which a signal is input and output to and from the control unit 1b.

The optical receiver 2 includes a light receiving unit 2a having plural light receiving elements disposed opposite the plural projection elements. The optical receiver 2 also includes a control unit 2b that controls the light receiving unit 2a and an I/O unit 2c that performs the input and output on the control unit 2b. The optical receiver 2 also includes a switch 2d and a communicator 2e. The switch 2d switches the connection of the control unit 2b and the I/O unit 2c to the connection of the control unit 2b and the communicator 2e. The communicator 2e conducts communication between the control unit 2b and the external device 50. The I/O unit 2c is a communication interface, which is connected to the communication cable 101, to control the input and output of a signal transmitted and received between the control unit 2b and the controller 6. The I/O unit 2c includes plural input units (such as a first input unit and a second input unit) that input a signal to the control unit 2b and plural output units (such as a first output unit and a second output unit) that output a signal from the control unit 2b.

The communication cable 101 includes plural signal wirings through which a signal is input and output to and from the control unit 2b.

For example, the control units 1b and 2b are constructed with a microcomputer including a CPU and a memory. The control units 1b and 2b control the projection unit 1a and the light receiving unit 2a in conjunction with each other such that the light emitting element of the projection unit 1a performs emission operation in synchronization with the light reception of the light receiving element of the light receiving unit 2a. The control unit 2b has a light shielding determination function. The control unit 2b determines whether each optical axis is in a light incidence state or the light shielding state by comparing a sequentially-obtained light reception amount of each optical axis to a predetermined threshold. In each circle of selection of the optical axis, the control unit 2b integrates determination results of the optical axes, and determines presence or absence of the light shielding as a whole detection area set by each optical axis.

The switch 2d switches the connection of the control unit 2b and the first input unit of the I/O unit 2c to the connection of the control unit 2b and the communicator 2e. When the switch 2d switches the connection of the control unit 2b and the first input unit to the connection of the control unit 2b and the communicator 2e, the control unit 2b can conduct communication with the external device 50 via the communicator 2e. That is, the switch 2d switches whether the signal wiring connected to the first input unit of the I/O unit 2c is used as a communication wiring or a signal wiring. The signal wiring, which is connected to the first input unit of the I/O unit 2c while the switch 2d is provided, is a common wiring that is also used as the communication wiring used in the communication with the external device 50. The signal wiring connected to the first input unit of the I/O unit 2c is one of the communication cables 101.

The communicator 2e is a communication interface that controls the communication between the control unit 2b and the external device 50. The external device 50 conducts communication with control unit 2b via the communicator 2e, which allows the external device 50 to monitor the setting change or operation of the multi-optical axis photoelectric sensor 100. For example, the communicator 2e is an RS485 standard interface.

The integrated light shielding determination result is input to the controller 6, and the controller 6 outputs a signal (stop signal) indicating a state of detection when it is determined that the light shielding is present. The controller 6 outputs a signal indicating a state of non-detection when it is determined that the light shielding is absent. The controller 6 acts as an output unit of the multi-optical axis photoelectric sensor 100. As illustrated in FIG. 2, the controller 6 may be provided separately from the projector 1 and the optical receiver 2, or incorporated in one of the projector 1 and the optical receiver 2.

The control unit 1b and the control unit 2b synchronize with each other, light the plural light emitting elements of the projection unit 1a in order, and process a light reception signal from the plural light receiving elements of the light receiving unit 2a in order. The control unit 1b and the control unit 2b synchronize with each other by optical communication of space optical transmission using the optical axis formed between the projection unit 1a and the light receiving unit 2a. The communication wiring is provided between the projection unit 1a and the light receiving unit 2a, and the control unit 1b and the control unit 2b may synchronize with each other using the communication through the communication wiring.

Returning to FIG. 1, a program is installed on the personal computer 5 in order to set various parameters to the multi-optical axis photoelectric sensor 100 and to display various states of the multi-optical axis photoelectric sensor 100. In addition to or instead of the personal computer 5, another display device (for example, a dedicated console) having a similar function may be connected to the communication unit 4.

Figure 3:
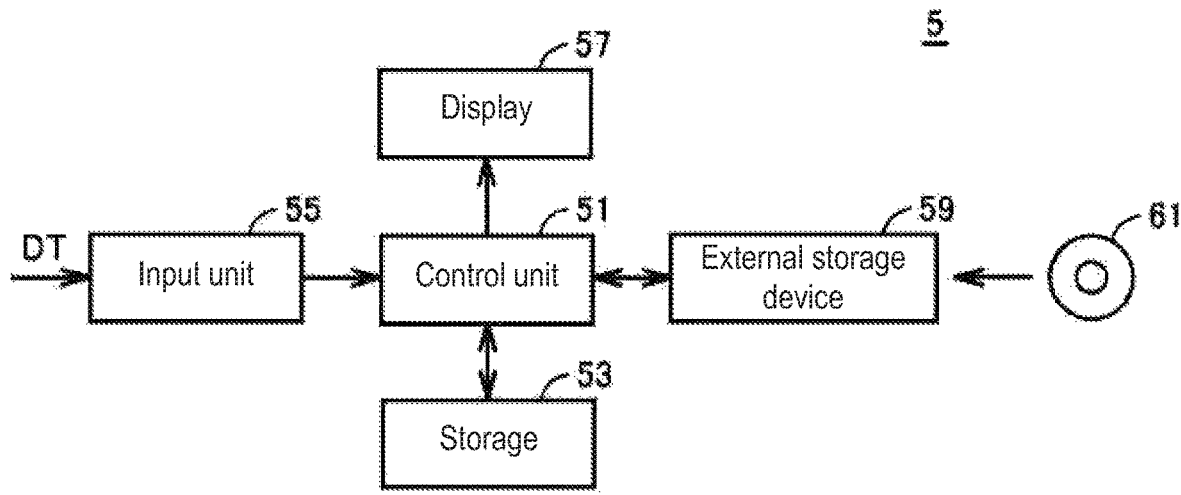
FIG. 3 is a view illustrating a configuration of a personal computer connected to the multi-optical axis photoelectric sensor of the first embodiment.

FIG. 3 is a view illustrating a configuration of the personal computer 5 connected to the multi-optical axis photoelectric sensor 100 of the first embodiment. Referring to FIG. 3, the personal computer 5 includes a control unit 51 that controls the whole personal computer, an input unit 55 to which data is input, a storage 53 in which data is temporarily stored, a display 57 that outputs data, and an external storage device 59 in which a program executed with the control unit 51 and the like are stored in a nonvolatile manner.

The control unit 51 includes a CPU and a read only memory (ROM) in which a program executed with the CPU is stored or a random access memory (RAM) in which variables and the like necessary for the execution of the program with the CPU are stored.

The input unit 55 is a keyboard or a mouse, and characters, figures, or a predetermined instruction can be input to the input unit 55. The input unit 55 receives data transmitted from the communication unit 4.

Various pieces of data necessary for the setting of the multi-optical axis photoelectric sensor 100 are temporarily stored in the storage 53.

For example, the display 57 is a liquid crystal display device. The display 57 displays various pieces of information (such as an operation result of the multi-optical axis photoelectric sensor 100) in response to an instruction of the control unit 51.

The external storage device 59 reads the program or data recorded in a computer-readable recording medium 61, and transmits the data to the control unit 51.

The common wiring for the signal wiring of the I/O unit 2c and the communication wiring of the communicator 2e will be described below in detail. In a conventional multi-optical axis photoelectric sensor, to connect the multi-optical axis photoelectric sensor to an external device such as a personal computer, it is necessary to provide a dedicated communication wiring or it is necessary to use a communication line between the projection unit and the light receiving unit. Therefore, in the conventional multi-optical axis photoelectric sensor, because the dedicated communication wiring is provided in addition to the signal wiring connected to the control unit, the number of wirings included in the communication cable is increased, and cost is also increased. On the other hand, in the multi-optical axis photoelectric sensor 100 of the first embodiment, the dedicated communication wiring is not added, but at least one of the signal wirings connected to the control unit 2b is used as the common wiring shared with the communication wiring. In the multi-optical axis photoelectric sensor 100, the communication wiring is used as the common wiring, and therefore a wring in which the connection becomes floating when the external device 50 is not connected does not exist unlike the dedicated communication wiring. Therefore, an influence of a noise through the floating wiring can be reduced, and a noise-proof property of the multi-optical axis photoelectric sensor 100 can be improved.

Specifically, the multi-optical axis photoelectric sensor 100 in FIG. 2 includes the switch 2d that switches the wiring through which the control unit 2b is directly connected to the first input unit of the I/O unit 2c to the wiring through which the control unit 2b is connected to the first input unit via the communicator 2e. Therefore, in the multi-optical axis photoelectric sensor 100, the signal wiring connected to the first input unit of the I/O unit 2c in the communication cables 101 is set to the common wiring shared with the communication wiring through which the communication with the external device 50 is conducted. For example, the first input unit of the I/O unit 2c is an input unit that inputs a control signal (muting signal) to control a muting function in the multi-optical axis photoelectric sensor 100. The wiring connected to the first input unit of the I/O unit 2c is the signal wiring to which a muting signal is input. As used herein, the muting function means a function of temporarily disabling the detection of the light shielding of the optical axis in the whole detection area during the input of the muting signal to the control unit 2b.

For example, the second input unit of the I/O unit 2c is an input unit that inputs a control signal (reset signal) to control a reset function in the multi-optical axis photoelectric sensor 100. As used herein, the reset function means a function of initializing the setting of the control unit 2b in inputting the reset signal to the control unit 2b. The switch 2d may be provided so as to switch the wiring through which the control unit 2b is directly connected to the second input unit of the I/O unit 2c to the wiring through which the control unit 2b is connected to the second input unit via the communicator 2e. Therefore, the signal wiring connected to the second input unit of the I/O unit 2c in the communication cables 101 can be used as the common wiring shared with the communication wiring through which the communication with the external device 50 is conducted.

For example, the first output unit of the I/O unit 2c is an output unit that outputs the determination result of the presence or absence of the light shielding with the control unit 2b. For example, the second output unit of the I/O unit 2c is an output unit that outputs an error of the control unit 2b. The switch 2d may be provided so as to switch the wiring through which the control unit 2b is directly connected to the first input unit or second output unit of the I/O unit 2c to the wiring through which the control unit 2b is connected to the first input unit or second output unit via the communicator 2e. Therefore, the signal wiring connected to the first input unit or second output unit of the I/O unit 2c in the communication cables 101 can be used as the common wiring shared with the communication wiring through which the communication with the external device 50 is conducted.

The switch 2d switches whether the common wiring is used as the communication wiring or the signal wiring. Instead of a configuration in which a user manually switches whether the common wiring is used as the communication wiring or the signal wiring, the switching may automatically be performed based on whether the external device 50 is connected to the dedicated cord 3 branched with the branch connector 102. A configuration that controls the switching of the switch 2d will be described below based on whether the external device 50 is connected to the dedicated cord 3.

The communicator 2e transmits a search signal to search whether the external device 50 is connected to the dedicated cord 3 branched with the branch connector 102. In the case that the external device 50 is not connected to the dedicated cord 3, a response signal to the search signal is not replied even if the search signal is transmitted. On the other hand, in the case that the external device 50 is connected to the dedicated cord 3, the external device 50 receives the search signal, and replies the response signal to the search signal within a predetermined time. The control unit 2b outputs a switching control signal to the switch 2d in the case that the communicator 2e receives the response signal from the external device 50. Based on the switching control signal, the switch 2d performs the switching to use the common wiring as the communication wiring. The communicator 2e directly outputs the switching control signal to the switch 2d, and the switch 2d may perform the switching to use the common wiring as the communication wiring based on the switching control signal.

Figure 4:
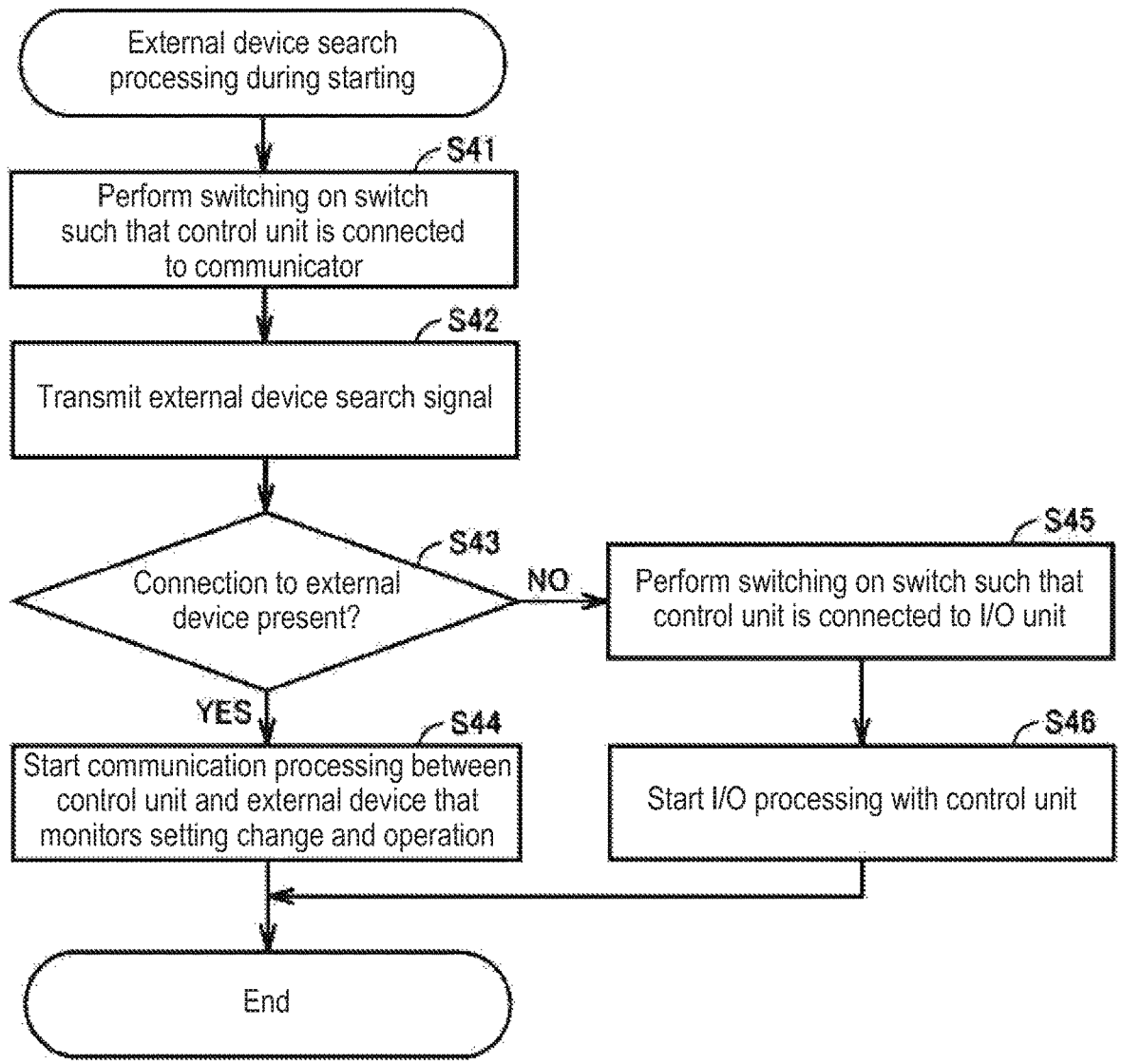
FIG. 4 is a flowchart illustrating external device search processing during starting of the multi-optical axis photoelectric sensor of the first embodiment.

The communicator 2e transmits the search signal (external device search processing) during starting of the multi-optical axis photoelectric sensor 100. The external device search processing during the starting of the multi-optical axis photoelectric sensor 100 will be described with reference to FIG. 4. FIG. 4 is a flowchart illustrating the external device search processing during the starting of the multi-optical axis photoelectric sensor 100 of the first embodiment. The control unit 2b switches the switch 2d so as to be connected to the communicator 2e (step S41). That is, the switch 2d performs the switching to use the common wiring as the communication wiring.

The control unit 2b controls the communicator 2e such that the communicator 2e transmits the search signal (external device search signal transmission) (step S42). The communicator 2e transmits the search signal under the control of the control unit 2b. After the communicator 2e transmits the search signal, the control unit 2b determines the presence or absence of the connection to the external device 50 based on the presence or absence of the response signal to the search signal from the communicator 2e (step S43). When determining the presence of the connection to the external device 50 (YES in step S43), the control unit 2b starts communication processing with the external device 50 via the communicator 2e to monitor the setting change or operation (step S44). Then, the control unit 2b ends the external device search processing during the starting.

On the other hand, when determining the absence of the connection to the external device 50 (NO in step S43), the control unit 2b switches the switch 2d so as to be connected to the first input unit of the I/O unit 2c (step S45). That is, the switch 2d performs the switching to use the common wiring as the signal wiring. The control unit 2b starts I/O processing of outputting and inputting a signal to and from the communication cable 101 via the I/O unit 2c (step S46). Then, the control unit 2b ends the external device search processing during the starting. For example, the start of the I/O processing enables the control signal (muting signal) to be input from the controller 6 to the first input unit of the I/O unit 2c.

Figure 5:
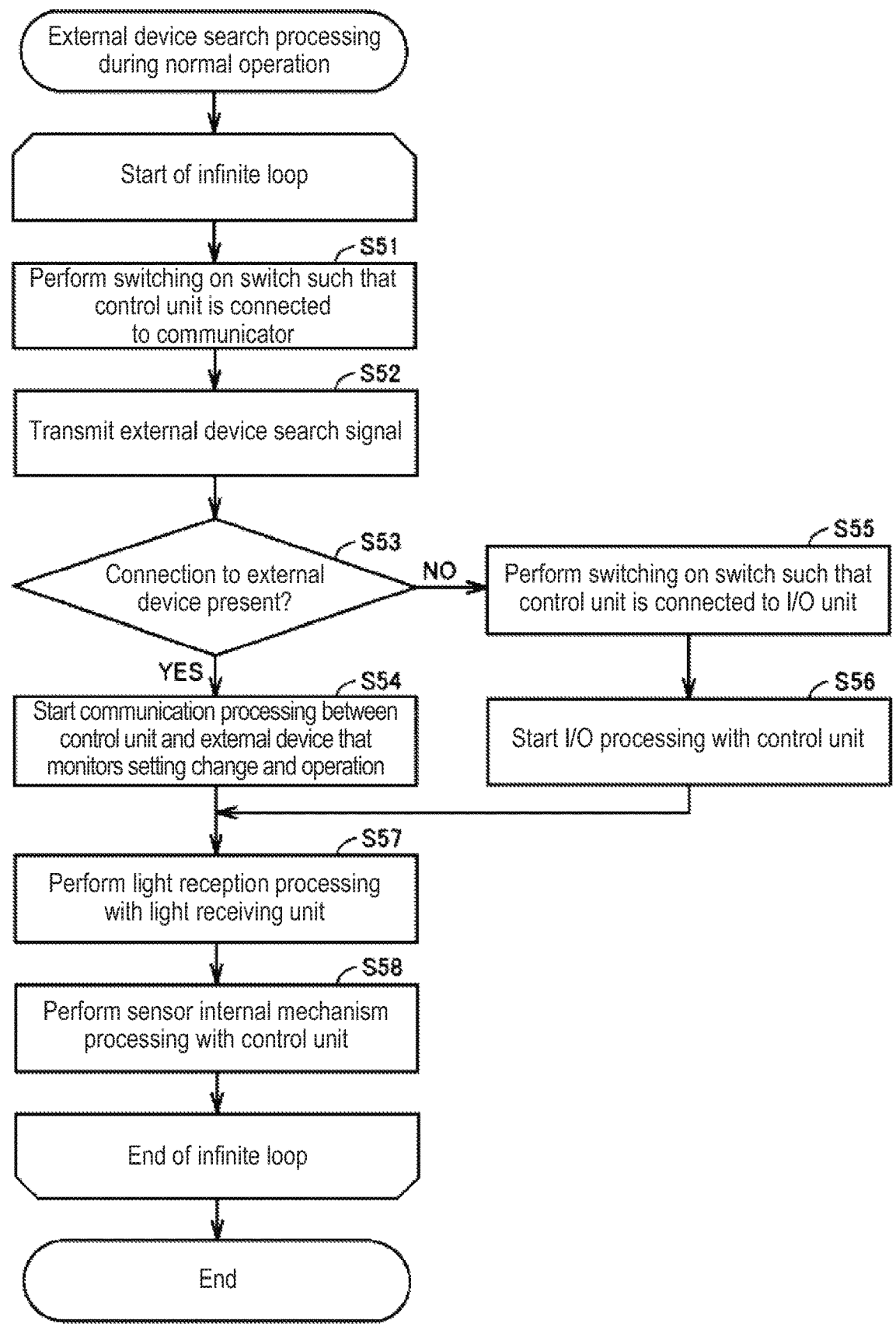
FIG. 5 is a flowchart illustrating external device search processing during normal operation of the multi-optical axis photoelectric sensor of the first embodiment.

In addition to the starting of the multi-optical axis photoelectric sensor 100, the communicator 2e periodically transmits the search signal during normal operation of the multi-optical axis photoelectric sensor 100. The external device search processing during the normal operation of the multi-optical axis photoelectric sensor 100 will be described with reference to FIG. 5. FIG. 5 is a flowchart illustrating the external device search processing during the normal operation of the multi-optical axis photoelectric sensor 100 of the first embodiment. The control unit 2b repeatedly performs processing steps from the start of the infinite loop to the end of an infinite loop during the normal operation of the multi-optical axis photoelectric sensor 100. The control unit 2b switches the switch 2d so as to be connected to the communicator 2e (step S51). That is, the switch 2d performs the switching to use the common wiring as the communication wiring.

The control unit 2b controls the communicator 2e such that the communicator 2e transmits the search signal (external device search signal transmission) (step S52). After the communicator 2e transmits the search signal, the control unit 2b determines the presence or absence of the connection to the external device 50 based on the presence or absence of the response signal to the search signal from the communicator 2e (step S53). When determining the presence of the connection to the external device 50 (YES in step 53), the control unit 2b starts communication processing with the external device 50 via the communicator 2e to monitor the setting change or operation (step S54).

On the other hand, when determining the absence of the connection to the external device 50 (NO in step S53), the control unit 2b switches the switch 2d so as to be connected to the first input unit of the I/O unit 2c (step S55). That is, the switch 2d performs the switching to use the common wiring as the signal wiring. The control unit 2b starts I/O processing of outputting and inputting a signal to and from the communication cable 101 via the I/O unit 2c (step S56).

Then, the control unit 2b ends the external device search processing during the starting.

The control unit 2b starts performance of light reception processing using the light receiving unit 2a (step S57).

The light receiving unit 2a performs the processing of receiving the light emitted from the projection unit 1a, which allows the light receiving unit 2a to detect whether each of the plural optical axes formed between the projection unit 1a and the light receiving unit 2a is in the light shielding state. The control unit 2b starts performance of sensor internal mechanism processing, such as a determination whether each optical axis is in the light incidence state or the light shielding state (step S58).

During the normal operation of the multi-optical axis photoelectric sensor 100, the communicator 2e transmits the search signal as many as the processing steps from the start of the infinite loop to the end of the infinite loop are repeated. That is, the communicator 2e periodically transmits the search signal during the operation of a sensor unit (the projection unit 1a and the light receiving unit 2a). Therefore, even if the external device 50 is connected to the multi-optical axis photoelectric sensor 100 during the normal operation of the multi-optical axis photoelectric sensor 100, the switch 2d can perform the switching to use the common wiring as the communication wiring. Even if the external device 50 is disconnected from the multi-optical axis photoelectric sensor 100 during the normal operation of the multi-optical axis photoelectric sensor 100, the switch 2d can perform the switching to use the common wiring as the signal wiring.

Figure 6:
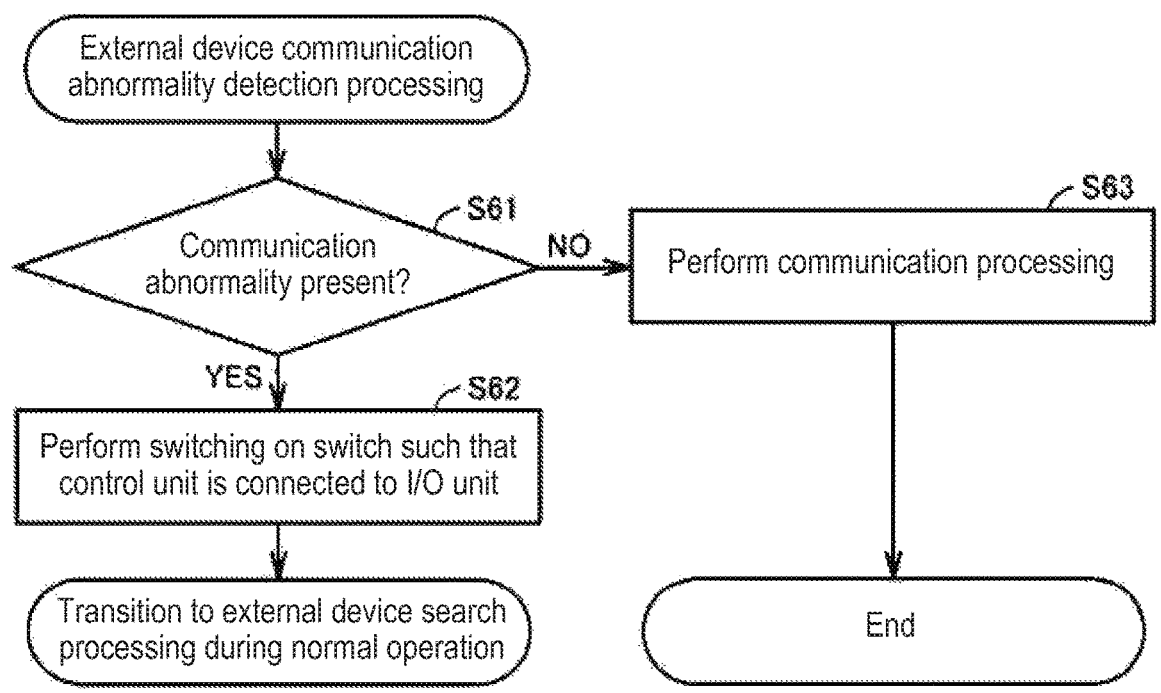
FIG. 6 is a flowchart illustrating external device communication abnormality detection processing of the multi-optical axis photoelectric sensor of the first embodiment.

Processing (external device communication abnormality detection processing), which is performed in the case that a communication abnormality between the control unit 2b and the external device 50 is detected, will be described below with reference to FIG. 6. FIG. 6 is a flowchart illustrating the external device communication abnormality detection processing of the multi-optical axis photoelectric sensor 100 of the first embodiment. The control unit 2b determines the presence or absence of the communication abnormality between the control unit 2b and the external device 50 (step S61). Specifically, the control unit 2b determines the presence of the communication abnormality between the control unit 2b and the external device 50 in the case that the control unit 2b cannot receive the response signal to the signal transmitted to the external device 50 within a predetermined time, or in the case that the control unit 2b receives a communication error signal from the external device 50.

When determining the presence of the communication abnormality between the control unit 2b and the external device 50 (YES in step S61), the control unit 2b causes the switch 2d to establish the connection to the first input unit of the I/O unit 2c in order to forcedly disconnect the communication with the external device 50 (step S62). That is, the switch 2d performs the switching to use the common wiring as the signal wiring. Then, the control unit 2b performs the external device search processing during the normal operation of the multi-optical axis photoelectric sensor 100 (see FIG. 5). In the external device search processing, whether the external device 50 is connected to the dedicated cord 3 is determined again, and the communication with the external device 50 is set again. Thus, continuation of the communication with the external device 50 in which the communication abnormality occurs can be avoided, and the wiring in which the communication is disconnected is switched to the signal wiring in which the control unit 2b is connected to the first input unit of the I/O unit 2c. Because the connection of the wiring in which the communication is disconnected does not remain in the floating state, the influence of the noise through the wiring can be reduced, and the noise-proof property of the multi-optical axis photoelectric sensor 100 can be improved.

On the other hand, when determining the absence of the communication abnormality between the control unit 2b and the external device 50 (NO in step S61), the control unit 2b continuously performs the communication processing (step S63). In FIG. 6, the external device communication abnormality detection processing is ended after the processing in step S63. The control unit 2b may repeatedly perform the external device communication abnormality detection processing during the continuation of the communication with the external device 50.

As described above, the multi-optical axis photoelectric sensor 100 of the first embodiment includes the projection unit 1a including the plural projection elements, the light receiving unit 2a including the plural light receiving elements disposed opposite the plural projection elements, and the sensor unit that detects whether each of the plural optical axes formed between the projection unit 1a and the light receiving unit 2a is in the light shielding state. The multi-optical axis photoelectric sensor 100 also includes the control unit 2b that controls the light receiving unit 2a, the communication cables 101 of the plural signal wirings through which the signal is input to and output from the control unit 2b, and the communicator 2e that conducts communication between the control unit 2b and the external device 50 through the common wiring sharing one of the communication cables 101 with the communication wiring. Therefore, in the multi-optical axis photoelectric sensor 100, it is not necessary to provide the dedicated communication wiring through which the communication between the control unit 2b and the external device 50 is conducted, but the number of wirings can be decreased. When the number of communication cables 101 is decreased, the wiring connection work or the wiring misconnection can be reduced in the case that the plural multi-optical axis photoelectric sensors 100 are installed.

The multi-optical axis photoelectric sensor 100 also includes the switch 2d that switches whether the common wiring is used as the communication wiring or the signal wiring. Therefore, in the multi-optical axis photoelectric sensor 100, the common wiring can be switched to both the communication wiring and the signal wiring when needed. For example, when the signal wiring which is connected to the first input unit of the I/O unit 2c to input the muting signal is used as the common wiring in the communication cables 101, the switch 2d switches the common wiring to the communication wiring when the communication with the external device 50 is conducted, and switches the common wiring to the signal wiring when the muting function is used in the multi-optical axis photoelectric sensor 100. For example, when the signal wiring which is connected to the second input unit of the I/O unit 2c to input the reset signal is used as the common wiring in the communication cables 101, the switch 2d switches the common wiring to the communication wiring when the communication with the external device 50 is conducted, and switches the common wiring to the signal wiring when the reset function is used in the multi-optical axis photoelectric sensor 100. The signal wiring used as the common wiring may be not only the signal wiring through which the control signal such as the muting signal is input but also the signal wiring through which the determination result of the presence or absence of the light shielding with the control unit 2b is output.

In the multi-optical axis photoelectric sensor 100, the communicator 2e transmits the search signal searching whether the external device 50 to be communicated with the control unit is connected to the multi-optical axis photoelectric sensor 100, and the control unit 2b switches the switch 2d such that the common wiring is used as the communication wiring in the case that the communicator 2e receives the response signal to the search signal from the external device 50. Therefore, when the external device 50 is connected to the multi-optical axis photoelectric sensor 100, the communication between the control unit 2b and the external device 50 can automatically be conducted while the common wiring is used as the communication wiring.

In the multi-optical axis photoelectric sensor 100, the communicator 2e periodically transmits the search signal during the operation of the sensor unit, so that the switch 2d can switch the common wiring even if the external device 50 is connected to and disconnected from the multi-optical axis photoelectric sensor 100 during the operation of the multi-optical axis photoelectric sensor 100. In the case that the communication between the multi-optical axis photoelectric sensor 100 and the external device 50 is disconnected, because the control unit 2b switches the switch 2d such that the common wiring is used as the signal wiring, the connection of the common wiring does not remain in the floating state, but the noise-proof property is improved.

Second Embodiment

Figure 7:
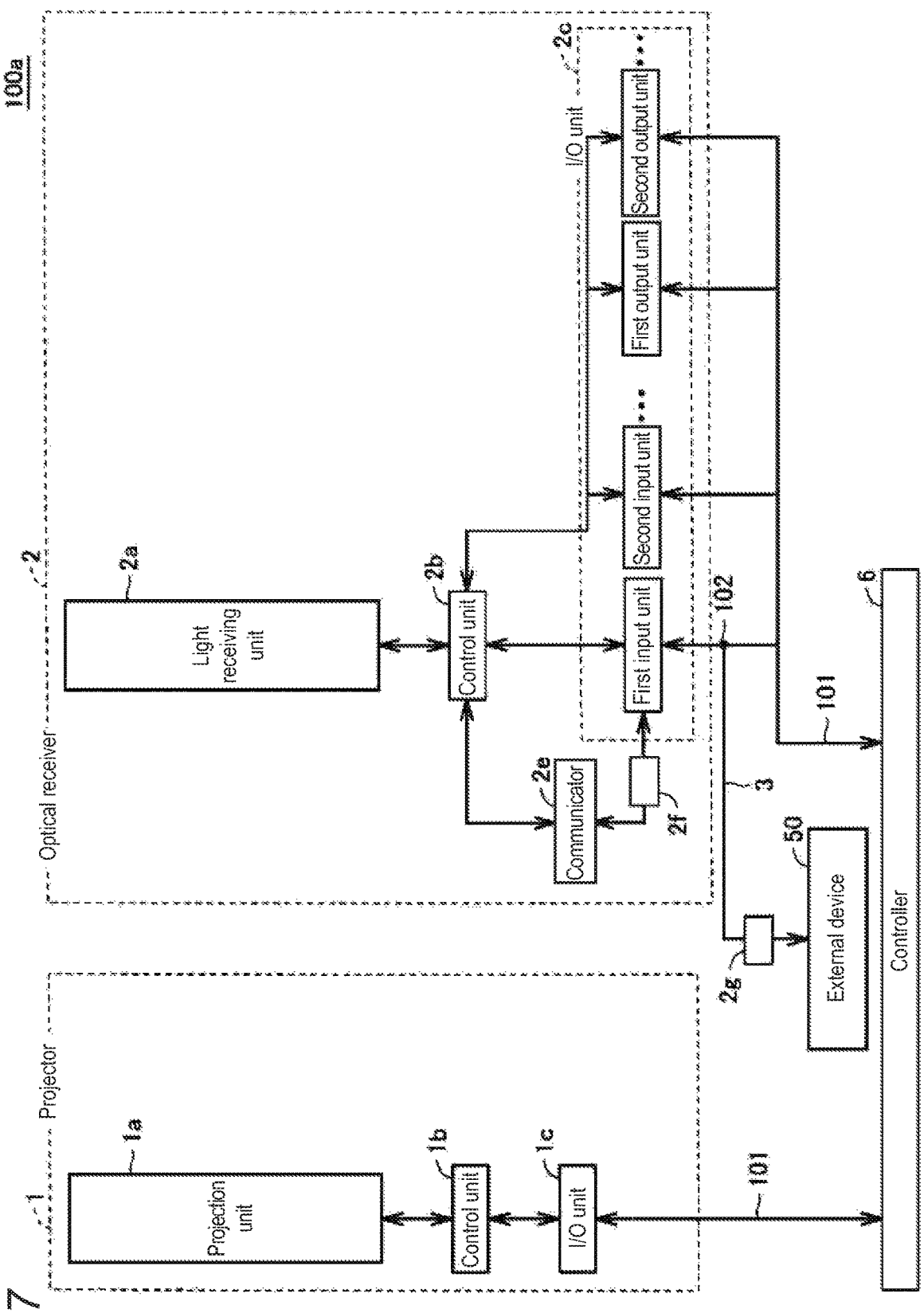
FIG. 7 is a block diagram illustrating a configuration of a multi-optical axis photoelectric sensor according to a second embodiment.

In the configuration of the multi-optical axis photoelectric sensor 100 of the first embodiment, the switch 2d switches whether the common wiring is used as the communication wiring or the signal wiring, and therefore the common wiring is shared among the communication wiring and the signal wiring. Whether the common wiring is used as the communication wiring or the signal wiring is not switched, but the common wiring has both the function used as the communication wiring and the function used as the signal wiring to be able to share the common wiring among the communication wiring and the signal wiring. In a multi-optical axis photoelectric sensor according to a second embodiment, a configuration in which the common wiring has both the function used as the communication wiring and the function used as the signal wiring will be described. FIG. 7 is a block diagram illustrating a configuration of the multi-optical axis photoelectric sensor of the second embodiment. A multi-optical axis photoelectric sensor 100a in FIG. 7 includes the projector 1, the optical receiver 2, and the controller 6. In the multi-optical axis photoelectric sensor 100a in FIG. 7, the same configuration as the multi-optical axis photoelectric sensor 100 in FIG. 2 is designated by the same numeral, and the detailed description will be omitted.

Referring to FIG. 7, the projector 1 includes the projection unit 1a including plural light emitting elements, the control unit 1b that controls the projection unit 1a, and the I/O unit 1c that performs the input and output on the control unit 1b. The optical receiver 2 includes a light receiving unit 2a having plural light receiving elements disposed opposite the plural projection elements. The optical receiver 2 also includes a control unit 2b that controls the light receiving unit 2a and an I/O unit 2c that performs the input and output on the control unit 2b. The optical receiver 2 also includes the communicator 2e that conducts communication between the control unit 2b and the external device 50, a converter 2f in the middle between the communicator 2e and the I/O unit 2c, and a converter 2g in the middle of the dedicated cord 3.

The converters 2f and 2g perform conversion into a communication signal having a frequency band different from that of the signal used in the signal wiring. The converters 2f and 2g vary the frequency band of the communication signal from the frequency band of the signal wiring, which allows the communication between the control unit 2b and the external device 50 to be conducted while the communication signal is superposed on the signal wiring. For example, in the case that the control signal (muting signal) input to the first input unit of the I/O unit 2c has the kilohertz (kHz) frequency band or less, the converters 2f and 2g perform the conversion into the communication signal having the megahertz (MHz) frequency band or more, whereby the control signal and the communication signal can be superposed on each other in the wiring (common wiring) connected to the same first input unit of the I/O unit 2c.

Specifically, in the case that the control unit 2b transmits the communication signal to the external device 50, the converter 2f converts the frequency band of the communication signal received from the control unit 2b into the gigahertz frequency band, and outputs the communication signal having the gigahertz frequency band to the first input unit of the I/O unit 2c. The output communication signal is input to the converter 2g through the communication cable 101 connected to the first input unit of the I/O unit 2c, the branch connector 102, and the dedicated cord 3. The communication signal input to the converter 2g is converted into the original frequency band, and output to the external device 50. In the case that the external device 50 transmits the communication signal to the control unit 2b, the converter 2g converts the frequency band of the communication signal received from the external device 50 into the gigahertz frequency band, and outputs the communication signal having the gigahertz frequency band to the first input unit of the I/O unit 2c. The output communication signal is input to the converter 2f through the dedicated cord 3, the branch connector 102, and the communication cable 101 connected to the first input unit of the I/O unit 2c. The communication signal input to the converter 2f is converted into the original frequency band, and output to the control unit 2b.

As described above, in the multi-optical axis photoelectric sensor 100a of the second embodiment, the use of the converters 2f and 2g that perform the conversion into the communication signal having the frequency band different from that of the signal used in the signal wiring can provide both the function used as the communication wiring and the function used as the signal wiring to the common wiring. The converters 2f and 2g are described only by way of example, and any configuration may be adopted as long as both the function used as the communication wiring and the function used as the signal wiring can be provided to the common wiring. For example, the signal is transmitted to the common wiring while a period of time the communication signal is transmitted and a period of time the control signal is transmitted are separated from each other, whereby both the function used as the communication wiring and the function used as the signal wiring may be provided to the common wiring.

Third Embodiment

Figure 8:
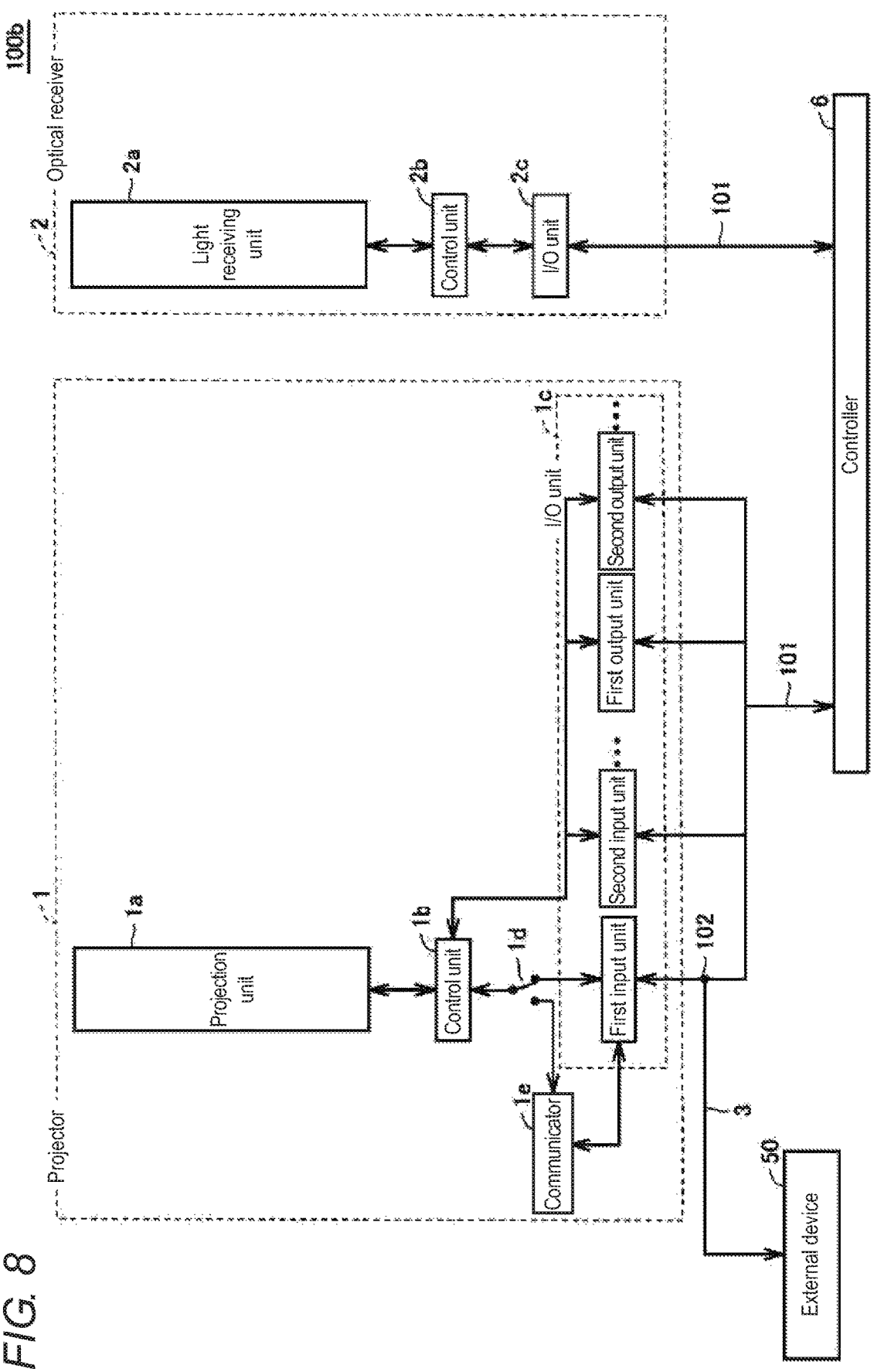
FIG. 8 is a block diagram illustrating a configuration of a multi-optical axis photoelectric sensor according to a third embodiment.

In the configuration of the multi-optical axis photoelectric sensor 100 of the first embodiment, at least one wiring in the plural signal wirings through which the signal is input to and output from the control unit 2b of the optical receiver 2 is used as the common wiring shared with the communication wiring. However, the configuration of the common wiring shared with the communication wiring is not limited to the signal wiring connected to the control unit 2b of the optical receiver 2, but the configuration may be applied to the signal wiring connected to the control unit 1b of the projector 1. As a multi-optical axis photoelectric sensor according to a third embodiment, the configuration of the common wiring is applied to the signal wiring connected to the control unit of the projector. FIG. 8 is a block diagram illustrating a configuration of the multi-optical axis photoelectric sensor of the third embodiment. A multi-optical axis photoelectric sensor 100b in FIG. 8 includes the projector 1, the optical receiver 2, and the controller 6. In the multi-optical axis photoelectric sensor 100b in FIG. 8, the same configuration as the multi-optical axis photoelectric sensor 100 in FIG. 2 is designated by the same numeral, and the detailed description will be omitted.

Referring to FIG. 8, the projector 1 includes the projection unit 1a including the plural light emitting elements. The projector 1 also includes the control unit 1b that controls the projection unit 1a and the I/O unit 1c that performs the input and output on the control unit 1b. The projector 1 also includes a switch 1d and a communicator 1e. The switch 1d switches the connection of the control unit 1b and the I/O unit 1c to the connection of the control unit 1b and the communicator 1e. The communicator 1e conducts communication between the control unit 1b and the external device 50. The I/O unit 1c is a communication interface, which is connected to the communication cable 101, to control the input and output of a signal transmitted and received between the control unit 1b and the controller 6. The I/O unit 1c includes plural input units (such as the first input unit and the second input unit) that input a signal to the control unit 1b and plural output units (such as the first output unit and the second output unit) that output a signal from the control unit 1b. The communication cable 101 includes plural signal wirings through which a signal is input and output to and from the control unit 1b.

The optical receiver 2 includes a light receiving unit 2a having plural light receiving elements disposed opposite the plural projection elements. The optical receiver 2 also includes a control unit 2b that controls the light receiving unit 2a and an I/O unit 2c that performs the input and output on the control unit 2b. The I/O unit 2c is a communication interface, which is connected to the communication cable 101, to control the input and output of a signal transmitted and received between the control unit 2b and the controller 6. The communication cable 101 includes plural signal wirings through which a signal is input and output to and from the control unit 2b.

The switch 1d switches the connection of the control unit 1b and the first input unit of the I/O unit 1c to the connection of the control unit 1b and the communicator 1e. When the switch 1d switches the connection of the control unit 1b and the first input unit to the connection of the control unit 1b and the communicator 1e, the control unit 1b can conduct communication with the external device 50 via the communicator 1e. That is, the switch 1d switches whether the signal wiring connected to the first input unit of the I/O unit 1c is used as the communication wiring or the signal wiring. The signal wiring, which is connected to the first input unit of the I/O unit 1c while the switch 1d is provided, is a common wiring that is also used as the communication wiring used in the communication with the external device 50. The signal wiring connected to the first input unit of the I/O unit 1c is one of the communication cables 101.

The communicator 1e is a communication interface that controls the communication between the control unit 1b and the external device 50. The external device 50 conducts communication with control unit 1b via the communicator 1e, which allows the external device 50 to monitor the setting change or operation of the multi-optical axis photoelectric sensor 100b. For example, the communicator 1e is an RS485 standard interface.

When the switch 1d is replaced with the switch 2d in FIG. 2, and when the communicator 1e is replaced with the communicator 2e in FIG. 2, because the operation of the multi-optical axis photoelectric sensor 100b in FIG. 8 is identical to that of the multi-optical axis photoelectric sensor 100 in FIG. 2, the detailed description will be omitted.

As described above, the multi-optical axis photoelectric sensor 100b of the third embodiment includes the projection unit 1a including the plural projection elements, the light receiving unit 2a including the plural light receiving elements disposed opposite the plural projection elements, and the sensor unit that detects whether each of the plural optical axes formed between the projection unit 1a and the light receiving unit 2a is in the light shielding state. The multi-optical axis photoelectric sensor 100b also includes the control unit 1b that controls the projection unit 1a, the communication cables 101 of the plural signal wirings through which the signal is input to and output from the control unit 1b, and the communicator 1e that conducts communication between the control unit 1b and the external device 50 through the common wiring sharing one of the communication cables 101 with the communication wiring. Therefore, in the multi-optical axis photoelectric sensor 100b, it is not necessary to provide the dedicated communication wiring through which the communication between the control unit 1b and the external device 50 is conducted, but the number of wirings can be decreased.

The multi-optical axis photoelectric sensor 100b also includes the switch 1d that switches whether the common wiring is used as the communication wiring or the signal wiring. Therefore, in the multi-optical axis photoelectric sensor 100b, the common wiring can be switched to both the communication wiring and the signal wiring when needed. For example, when the signal wiring which is connected to the first input unit of the I/O unit 1c to input the muting signal is used as the common wiring in the communication cables 101, the switch 1d switches the common wiring to the communication wiring when the communication with the external device 50 is conducted, and switches the common wiring to the signal wiring when the muting function is used in the multi-optical axis photoelectric sensor 100b. For example, when the signal wiring which is connected to the second input unit of the I/O unit 1c to input the reset signal is used as the common wiring in the communication cables 101, the switch 1d switches the common wiring to the communication wiring when the communication with the external device 50 is conducted, and switches the common wiring to the signal wiring when the reset function is used in the multi-optical axis photoelectric sensor 100b. The signal wiring used as the common wiring may be not only the signal wiring through which the control signal such as the muting signal is input but also the signal wiring through which the determination result of the presence or absence of the light shielding with the control unit 1b is output.

(Modifications)

(1) As described above, the multi-optical axis photoelectric sensor 100 of the first embodiment includes the control unit 2b that controls the light receiving unit 2a, the communication cables 101 of the plural signal wirings through which the signal is input to and output from the control unit 2*b*, and the communicator 2*e* that conducts communication between the control unit 2*b* and the external device 50 through the common wiring sharing one of the communication cables 101 with the communication wiring. Alternatively, in the multi-optical axis photoelectric sensor of the embodiment, the communicator may conduct communication between the control unit and the external device through plural common wirings sharing at least two communication cables with the communication wiring. That is, in the case that the control unit and the external device conduct communication with each other through plural wirings, the plural wirings in the communication cables may be used as the common wirings while shared with the communication wirings. In the multi-optical axis photoelectric sensor of the embodiment, in the case that the common wiring is provided on the projection unit side, at least two communication cables may be used as the plural common wirings shared with the communication wirings.

(2) In the multi-optical axis photoelectric sensor 100 of the first embodiment, the wiring which is connected to the first input unit of the I/O unit 2*c* to input the control signal (muting signal) is shared with the communication wiring.

Therefore, in the multi-optical axis photoelectric sensor 100, the control signal (muting signal) cannot be input to the control unit 2*b* in the case that the wiring connected to the first input unit of the I/O unit 2*c* with the switch 2*d* is used as the communication wiring. Alternatively, in the multi-optical axis photoelectric sensor of the embodiment, the control signal (muting signal) may be input from the personal computer of the external device to the control unit via the communicator. That is, the external device may control the multi-optical axis photoelectric sensor.

(3) In the multi-optical axis photoelectric sensor 100 of the first embodiment, the control unit 1*b* and the control unit 2*b* synchronize with each other by optical communication of space optical transmission using the optical axis formed between the projection unit 1*a* and the light receiving unit 2*a*. Therefore, in the multi-optical axis photoelectric sensor 100, the control unit 1*b* and the control unit 2*b* synchronize with each other, so that the communication wiring can also be decreased. In the multi-optical axis photoelectric sensor of the embodiment, the communication wiring is provided between the control unit of the projector and the control unit of the optical receiver, and the control unit 1*b* and the control unit 2*b* may synchronize with each other using the communication through the communication wiring.

The multi-optical axis photoelectric sensor 100, which is communicable with the external device 50 without using the communication wiring provided between the control unit 1*b* of the projector 1 and the control unit 2*b* of the optical receiver 2 and without adding the communication wiring to the external device 50, can be constructed in the case that the above configuration is applied to the multi-optical axis photoelectric sensor 100.

(4) In the configuration of the multi-optical axis photoelectric sensor 100 of the first embodiment, the switch 2*d* is provided between the control unit 2*b* and the I/O unit 2*c* to switch whether the signal wiring connected to the first input unit of the I/O unit 2*c* is used as the communication wiring or the signal wiring. Alternatively, in the multi-optical axis photoelectric sensor of the embodiment, the switch may be provided between the I/O unit and the branch connector to switch whether the signal wiring is used as the communication wiring or the signal wiring.

(5) In the configuration of the multi-optical axis photoelectric sensor 100 of the first embodiment, after the control unit 2*b* switches the switch 2*d* so as to be connected to the communicator 2*e* (step S41), the communicator 2*e* transmits the search signal (step S42). Alternatively, in the multi-optical axis photoelectric sensor of the embodiment, the control unit may perform the control to transmit the search signal from the communicator before performing the switching so as to be connected to the communicator. In this configuration, when the response signal to the search signal is present, the switch performs the switching so as to connect the control unit and the communicator to each other.

The disclosed embodiments are illustrative in all respects, but are not restrictive. The scope of the present invention is indicated by not the above description but the claims, and it is intended that the meanings equivalent to the claims and all the changes within the scope of the present invention are included in the scope of the present invention.

The invention claimed is:

1. A multi-optical axis photoelectric sensor comprising:
a sensor unit configured to detect whether each of a plurality of optical axes formed between a projection unit and a light receiving unit is in a light shielding state, the sensor unit comprising the projection unit and the light receiving unit, the projection unit comprising a plurality of projection elements, the light receiving unit comprising a plurality of light receiving elements disposed opposite the plurality of projection elements;
a control unit configured to control the projection unit or the light receiving unit, the control unit being provided in each of the projection unit and the light receiving unit;
a plurality of signal wirings through which a signal is input to and output from the control unit; and
a communicator configured to conduct communication between the control unit and an external device, wherein
at least one of the plurality of signal wirings comprises a common wiring sharing with a communication wiring for communicating with the communicator.

2. The multi-optical axis photoelectric sensor according to claim 1, wherein the common wiring comprises a signal wiring through which a control signal is input to the control unit.

3. The multi-optical axis photoelectric sensor according to claim 2, wherein the signal wiring through which the control signal is input to the control unit comprises a signal wiring through which a muting signal is input, the muting signal disabling temporarily a function.

4. The multi-optical axis photoelectric sensor according to claim 2, wherein the signal wiring through which the control signal is input to the control unit comprises a signal wiring through which a reset signal is input, the reset signal initializing the control unit.

5. The multi-optical axis photoelectric sensor according to claim 1, further comprising a switch configured to switch whether the common wiring is used as the communication wiring or the signal wiring.

6. The multi-optical axis photoelectric sensor according to claim 5, wherein the communicator transmits a search signal searching whether the external device to be communicated with the control unit is connected to the multi-optical axis photoelectric sensor, and
the control unit switches the switch such that the common wiring is used as the communication wiring when the communicator receives a response signal to the search signal from the external device.

7. The multi-optical axis photoelectric sensor according to claim 6, wherein the communicator periodically transmits the search signal during operation of the sensor unit.

8. The multi-optical axis photoelectric sensor according to claim 5, wherein, when communication with the external device is disconnected, the control unit switches the switch such that the common wiring is used as the signal wiring.

9. The multi-optical axis photoelectric sensor according to claim 1, further comprising a converter configured to perform conversion into a communication signal having a frequency band different from a frequency band of a signal used in the signal wiring,
    wherein the communicator conducts communication between the control unit and the external device using the communication signal converted with the converter in the common wiring.

10. The multi-optical axis photoelectric sensor according to claim 1, wherein the projection unit and the light receiving unit synchronize with each other using an optical axis formed between the projection unit and the light receiving unit.

\* \* \* \* \*